US012666853B2

(12) United States Patent
Liao et al.

(10) Patent No.: US 12,666,853 B2
(45) Date of Patent: Jun. 23, 2026

(54) METHOD OF MANUFACTURING OLED USING SOLVENTS WITH DIFFERENT VAPOR PRESSURES

(71) Applicants: Hefei BOE Joint Technology Co., Ltd., Anhui (CN); BOE Technology Group Co., Ltd., Beijing (CN)

(72) Inventors: Chinlung Liao, Beijing (CN); Wenbin Jia, Beijing (CN); Hongli Wang, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 575 days.

(21) Appl. No.: 18/247,407

(22) PCT Filed: Oct. 22, 2021

(86) PCT No.: PCT/CN2021/125518
§ 371 (c)(1),
(2) Date: Mar. 30, 2023

(87) PCT Pub. No.: WO2022/217879
PCT Pub. Date: Oct. 20, 2022

(65) Prior Publication Data
US 2023/0413654 A1 Dec. 21, 2023

(30) Foreign Application Priority Data

Apr. 15, 2021 (CN) .......................... 202110403595.5

(51) Int. Cl.
*H10K 59/12* (2023.01)
*H10K 59/122* (2023.01)
(Continued)

(52) U.S. Cl.
CPC ....... *H10K 71/135* (2023.02); *H10K 59/1201* (2023.02); *H10K 59/122* (2023.02);
(Continued)

(58) Field of Classification Search
CPC .................................................. H10K 59/1201
See application file for complete search history.

(56) References Cited

U.S. PATENT DOCUMENTS

2005/0218792 A1* 10/2005 Jianpu .................. H10K 59/351
313/502
2006/0066702 A1* 3/2006 Sakurai ................ H10K 71/135
347/102

(Continued)

FOREIGN PATENT DOCUMENTS

CN 103141158 A 6/2013
CN 106953030 A 7/2017
(Continued)

OTHER PUBLICATIONS

Extended European Search Report, mailed Apr. 19, 2024, from European Application Serial No. 21936746.3, 11 pages.

*Primary Examiner* — Peter Bradford
(74) *Attorney, Agent, or Firm* — Workman Nydegger

(57) ABSTRACT

A manufacturing method for a display substrate, a display substrate, and a display device. The uniformity of film thicknesses of light-emitting functional layers in sub-pixel regions of different colors can be achieved, the effective aperture ratio of the sub-pixel regions of different colors can be ensured, and the service life of the device can be prolonged. The manufacturing method includes: providing a base substrate, the base substrate including a plurality of sub-pixel regions of different colors; printing a solution of a light-emitting functional layer in each sub-pixel region, in which the volumes of the solution in the sub-pixel regions of different colors are positively correlated with the saturated (Continued)

vapor pressure of the solution; and performing vacuum drying on the solution to form light-emitting functional layers having uniform film thicknesses.

15 Claims, 7 Drawing Sheets

(51) Int. Cl.
| | | |
|---|---|---|
| *H10K 71/13* | (2023.01) | |
| *H10K 59/35* | (2023.01) | |
| *H10K 102/00* | (2023.01) | |

(52) U.S. Cl.
CPC ............. *H10K 71/13* (2023.02); *H10K 59/35* (2023.02); *H10K 2102/351* (2023.02)

(56) References Cited

U.S. PATENT DOCUMENTS

| | | | |
|---|---|---|---|
| 2013/0082249 | A1 | 4/2013 | Kawanami et al. |
| 2016/0359112 | A1 | 12/2016 | Wang et al. |
| 2017/0125486 | A1 | 5/2017 | Chen |
| 2017/0271419 | A1* | 9/2017 | Cui ........................ H10K 50/82 |
| 2020/0091251 | A1 | 3/2020 | Hu et al. |
| 2020/0127241 | A1 | 4/2020 | Kim et al. |
| 2020/0192151 | A1 | 6/2020 | Dai |
| 2020/0263924 | A1 | 8/2020 | Hu et al. |
| 2022/0278277 | A1 | 9/2022 | Jia et al. |

FOREIGN PATENT DOCUMENTS

| | | | | |
|---|---|---|---|---|
| CN | 108336123 | A | | 7/2018 |
| CN | 109059436 | A | | 12/2018 |
| CN | 111081902 | A | | 4/2020 |
| CN | 111509144 | A | | 8/2020 |
| CN | 111933682 | A | | 11/2020 |
| CN | 112042275 | A | | 12/2020 |
| JP | 2004330136 | A | | 11/2004 |
| JP | 2006278214 | A | * | 10/2006 |
| JP | 2014104408 | A | * | 6/2014 |
| TW | 201033301 | A | | 1/2010 |

* cited by examiner

METHOD OF MANUFACTURING OLED USING SOLVENTS WITH DIFFERENT VAPOR PRESSURES

CROSS REFERENCE TO RELATED APPLICATIONS

The application is a US National Stage of International Application No. PCT/CN2021/125518, filed on Oct. 22, 2021, which claims the priority of the Chinese patent application No. 202110403595.5 filed to the China National Intellectual Property Administration on Apr. 15, 2021, and entitled "MANUFACTURING METHOD FOR DISPLAY SUBSTRATE, DISPLAY SUBSTRATE, AND DISPLAY DEVICE", of which the entire contents are incorporated herein by reference.

FIELD

The disclosure relates to the field of display technology, in particular to a manufacturing method for a display substrate, the display substrate, and a display apparatus.

BACKGROUND

An organic light-emitting device (OLED), as a new type of light-emitting device, has shown great application potential in the fields of display and illumination, and has received great attention from academic and industrial circles. In the field of display, compared with a liquid crystal display device (LCD), the organic light-emitting device has advantages of self-illumination, fast response, wide viewing angle, high brightness, bright color, light weight and the like, and is considered to be the next generation of display technology.

SUMMARY

Embodiments of the disclosure provide a manufacturing method for a display substrate, a display substrate, and a display apparatus, specific solutions are as follows.

In an aspect, an embodiment of the disclosure provides a manufacturing method for a display substrate, including: providing a base substrate, where the base substrate comprises a plurality of sub-pixel regions of different colors; printing a solution of a light-emitting functional layer in the plurality of sub-pixel regions, where volumes of the solution in sub-pixel regions of different colors are positively correlated with a saturated vapor pressure of the solution; and performing vacuum drying on the solution to form the light-emitting functional layer having a uniform film thickness.

In some embodiments, in the above manufacturing method provided by the embodiment of the disclosure, the solution includes a first solvent and a second solvent that are miscible, and a saturated vapor pressure of the first solvent is less than a saturated vapor pressure of the second solvent.

In some embodiments, in the above manufacturing method provided by the embodiment of the disclosure, the sub-pixel regions include a plurality of red sub-pixel regions, a plurality of green sub-pixel regions and a plurality of blue sub-pixel regions. The printing the solution of the light-emitting functional layers in the plurality of sub-pixel regions includes: printing a first solution of the light-emitting functional layers in the plurality of red sub-pixel regions, printing a second solution of the light-emitting functional layers in the plurality of green sub-pixel regions, and printing a third solution of the light-emitting functional layers in the plurality of blue sub-pixel regions, where a volume of the second solution is greater than or equal to a volume of the third solution and less than or equal to a volume of the first solution, and a saturated vapor pressure of the second solution is greater than or equal to a saturated vapor pressure of the third solution and less than or equal to a saturated vapor pressure of the first solution.

In some embodiments, in the above manufacturing method provided by the embodiment of the disclosure, a ratio of the saturated vapor pressure of the first solution to the saturated vapor pressure of the second solution to the saturated vapor pressure of the third solution is (2.5-1):(2.5-1):1.

In some embodiments, in the above manufacturing method provided by the embodiment of the disclosure, volume proportions of the first solvent in the first solution, the second solution and the third solution sequentially increase, and volume proportions of the second solvent in the first solution, the second solution and the third solution sequentially decrease.

In some embodiments, in the above manufacturing method provided by the embodiment of the disclosure, in the first solution, a volume proportion of the first solvent in the first solution is 5% to 30%, and a volume proportion of the second solvent in the first solution is 70% to 95%; a volume proportion of the first solvent in the second solution is 30% to 60%, and a volume proportion of the second solvent in the second solution is 40% to 70%; and a volume proportion of the first solvent in the third solution is 60% to 95%, and a volume proportion of the second solvent in the third solution is 5% to 40%.

In some embodiments, in the above manufacturing method provided by the embodiment of the disclosure, the first solvent is one or any combination of cumene, isopropyltoluene, 1,3,5-trimethylbenzene, dimethylanisole, or p-diethylbenzene, and the second solvent is one or any combination of chlorobenzene, cyclohexanone, or o-xylene.

In some embodiments, in the above manufacturing method provided by the embodiment of the disclosure, the light-emitting functional layer is a hole injection layer or a light-emitting material layer, and the volume of the second solution is greater than the volume of the third solution and less than the volume of the first solution; or the light-emitting functional layer is a hole transport layer, and the volume of the second solution is greater than or equal to the volume of the third solution and less than or equal to the volume of the first solution.

In some embodiments, in the above manufacturing method provided by the embodiment of the disclosure, the light-emitting functional layer is the hole injection layer or the hole transport layer, and a concentration of the first solution, a concentration of the second solution, and a concentration of the third solution are the same; or the light-emitting functional layer is the light-emitting material layers, and the concentration of the first solution is greater than or equal to the concentration of the third solution and less than or equal to the concentration of the second solution.

In some embodiments, in the above manufacturing method provided by the embodiment of the disclosure, after providing the base substrate and before printing the solution of the light-emitting functional layers in the plurality of sub-pixel regions, the manufacturing method further includes: forming a pixel defining layer on the base substrate. The pixel defining layer includes a first pixel opening in the red sub-pixel region, a second pixel opening in the green sub-pixel region, and a third pixel opening in the blue sub-pixel region. An area of the third pixel opening is less than an area of the second pixel opening and greater than an area of the first pixel opening.

In some embodiments, in the above manufacturing method provided by the embodiment of the disclosure, the plurality of green sub-pixel regions include: a plurality of first-type green sub-pixel regions and a plurality of second-type green sub-pixel regions. An area of the second pixel opening corresponding to the first-type green sub-pixel region is greater than an area of the second pixel opening corresponding to the second-type green sub-pixel region. A saturated vapor pressure of the second solution corresponding to the first-type green sub-pixel region is less than a saturated vapor pressure of the second solution corresponding to the second-type green sub-pixel region.

In some embodiments, in the above manufacturing method provided by the embodiment of the disclosure, a ratio of the saturated vapor pressure of the first solution to the saturated vapor pressure of the second solution corresponding to the first-type green sub-pixel region to the saturated vapor pressure of the second solution corresponding to the second-type green sub-pixel region to the saturated vapor pressure of the third solution is 1.746:1.404:1.378:1.

In some embodiments, in the above manufacturing method provided by the embodiment of the disclosure, after providing the base substrate and before forming the pixel defining layer on the base substrate, the manufacturing method further includes: forming a plurality of first electrodes in the plurality of sub-pixel regions.

In some embodiments, in the above manufacturing method provided by the embodiment of the disclosure, after performing vacuum drying on the solution to form the light-emitting functional layer having the uniform film thickness, the manufacturing method further includes: forming an electron transport layer, an electron injection layer and a second electrode sequentially on the light-emitting functional layer.

In another aspect, an embodiment of the disclosure provides a display substrate, including: a base substrate, having a plurality of sub-pixel regions of different light-emitting colors; a pixel defining layer, disposed on the base substrate and having a pixel opening in each sub-pixel region; and a light-emitting functional layer, disposed on a side of the pixel defining layer facing away from the base substrate. The light-emitting functional layer is at least partially located within the pixel opening, and the light-emitting functional layer includes a central region away from the pixel defining layer, a climbing region in contact with the pixel defining layer, and a transition region located between the central region and the climbing region. In a direction perpendicular to the base substrate, a difference between a thickness of the light-emitting functional layer in the central region and a target thickness of the light-emitting functional layer is less than or equal to 5 nm, a difference between a thickness of the light-emitting functional layer in the transition region and the target thickness of the light-emitting functional layer is greater than 5 nm and less than or equal to 20 nm, and a difference between a thickness of the light-emitting functional layer in the climbing region and the target thickness of the light-emitting functional layer is greater than 20 nm.

In some embodiments, in the above display substrate provided by the embodiment of the disclosure, 70% to 90% of an entire projection area of the light-emitting functional layer radiating outward from a center and having a shape contour roughly same as that of the pixel opening is the central region is the central region, 0 to 5% of the entire projection area of the light-emitting functional layer covering the pixel defining layer and having a shape contour roughly same as that of the pixel opening is the climbing region; and 5% to 30% of the entire projection area of the light-emitting functional layer located between the climbing region and the central region and having a shape contour roughly same as that of the pixel opening is the transition region.

In some embodiments, in the above display substrate provided by the embodiment of the disclosure, thickness uniformity of the light-emitting functional layer within the pixel opening is positively correlated with an area of the pixel opening.

In some embodiments, in the above display substrate provided by the embodiment of the disclosure, the sub-pixel regions include a first sub-pixel region, a second sub-pixel region and a third sub-pixel region, the pixel opening includes a first pixel opening located in the first sub-pixel region, a second pixel opening located in the second sub-pixel region, and a third pixel opening located in the third sub-pixel region, an area of the third pixel opening is greater than an area of the first pixel opening and less than an area of the second pixel opening. The light-emitting functional layer includes a hole injection layer, a hole transport layer and a light-emitting material layer; and thickness uniformity of the hole injection layer in the first pixel opening, the third pixel opening and the second pixel opening sequentially increases, thickness uniformity of the hole transport layer in the first pixel opening, the third pixel opening and the second pixel opening sequentially increases, and thickness uniformity of the light-emitting material layer in the first pixel opening, the third pixel opening and the second pixel opening sequentially increases.

In some embodiments, in the above display substrate provided by the embodiment of the disclosure, the sub-pixel regions include a first sub-pixel region, a second sub-pixel region and a third sub-pixel region, and the light-emitting functional layer includes a hole injection layer, a hole transport layer and a light-emitting material layer. An average thickness of the hole injection layer in the first sub-pixel region is 40 nm to 50 nm, an average thickness of the hole injection layer in the second sub-pixel region is 40 nm to 50 nm, and an average thickness of the hole injection layer in the third sub-pixel region is 30 nm to 40 nm. An average thickness of the hole transport layer in the first sub-pixel region is 20 nm to 28 nm, an average thickness of the hole transport layer in the second sub-pixel region is 20 nm to 27 nm, and an average thickness of the hole transport layer in the third sub-pixel region is 20 nm to 27 nm. An average thickness of the light-emitting material layer in the first sub-pixel region is 120 nm to 135 nm, an average thickness of the light-emitting material layer in the second sub-pixel region is 80 nm to 95 nm, and an average thickness of the light-emitting material layer in the third sub-pixel region is 60 nm to 72 nm.

In some embodiments, in the above display substrate provided by the embodiment of the disclosure, light-emitting efficiency of the first sub-pixel region is 11.5 Cd/A to 15.6 Cd/A, light-emitting efficiency of the second sub-pixel region is 35.1 Cd/A to 41.2 Cd/A, and light-emitting efficiency of the third sub-pixel region is 33 Cd/A to 46 Cd/A.

In some embodiments, in the above display substrate provided by the embodiment of the disclosure, the sub-pixel regions include a first sub-pixel region, a second sub-pixel region and a third sub-pixel region, and the light-emitting functional layer includes a hole injection layer, a hole transport layer and a light-emitting material layer. An average thickness of the hole injection layer in the first sub-pixel region is 12 nm to 20 nm, an average thickness of the hole injection layer in the second sub-pixel region is 6 nm to 12 nm, and an average thickness of the hole injection layer in the third sub-pixel region is 6 nm to 12 nm. An average thickness of the hole transport layer in the first sub-pixel region is 21 nm to 30 nm, an average thickness of the hole transport layer in the second sub-pixel region is 16 nm to 26 nm, and an average thickness of the hole transport layer in the third sub-pixel region is 11 nm to 20 nm. An average thickness of the light-emitting material layer in the first sub-pixel region is 87 nm to 105 nm, an average thickness of the light-emitting material layer in the second sub-pixel region is 63 nm to 78 nm, and an average thickness of the light-emitting material layer in the third sub-pixel region is 55 nm to 70 nm.

In some embodiments, in the above display substrate provided by the embodiment of the disclosure, light-emitting efficiency of the first sub-pixel region is 16.8 Cd/A to 20.3 Cd/A, light-emitting efficiency of the second sub-pixel region is 36.5 Cd/A to 49.5 Cd/A, and light-emitting efficiency of the third sub-pixel region is 32.4 Cd/A to 47.2 Cd/A.

In some embodiments, the above display substrate provided by the embodiment of the disclosure further includes: an electron transport layer, an electron injection layer and a second electrode which are arranged sequentially on a side of the light-emitting material layer facing away from the base substrate, where the electron transport layer, the electron injection layer and the second electrode respectively cover all of the sub-pixel regions.

In some embodiments, in the above display substrate provided by the embodiment of the disclosure, in the first sub-pixel region and the second sub-pixel region, a target thickness of the hole injection layer is 15% to 17% of a sum of thicknesses of the hole injection layer, the hole transport layer, the light-emitting material layer, the electron transport layer and the electron injection layer; and in the third sub-pixel region, the target thickness of the hole injection layer is 12% to 15% of the sum of the thicknesses of the hole injection layer, the hole transport layer, the light-emitting material layer, the electron transport layer and the electron injection layer. In the first sub-pixel region, a target thickness of the hole transport layer is 6% to 8% of the sum of the thicknesses of the hole injection layer, the hole transport layer, the light-emitting material layer, the electron transport layer and the electron injection layer; in the second sub-pixel region, the target thickness of the hole transport layer is 7% to 10% of the sum of the thicknesses of the hole injection layer, the hole transport layer, the light-emitting material layer, the electron transport layer and the electron injection layer; and in the third sub-pixel region, the target thickness of the hole transport layer is 9% to 11% of the sum of the thicknesses of the hole injection layer, the hole transport layer, the light-emitting material layer, the electron transport layer and the electron injection layer. In the first sub-pixel region, a target thickness of the light-emitting material layer is 38% to 40% of the sum of the thicknesses of the hole injection layer, the hole transport layer, the light-emitting material layer, the electron transport layer and the electron injection layer; in the second sub-pixel region, the target thickness of the light-emitting material layer is 30% to 32% of the sum of the thicknesses of the hole injection layer, the hole transport layer, the light-emitting material layer, the electron transport layer and the electron injection layer; and in the third sub-pixel region, the target thickness of the light-emitting material layer is 25% to 28% of the sum of the thicknesses of the hole injection layer, the hole transport layer, the light-emitting material layer, the electron transport layer and the electron injection layer.

In some embodiments, in the above display substrate provided by the embodiment of the disclosure, in the first sub-pixel region, a target thickness of the hole injection layer is 10% to 14% of a sum of thicknesses of the hole injection layer, the hole transport layer, the light-emitting material layer, the electron transport layer and the electron injection layer; in the second sub-pixel region, the target thickness of the hole injection layer is 7% to 13% of the sum of the thicknesses of the hole injection layer, the hole transport layer, the light-emitting material layer, the electron transport layer and the electron injection layer; and in the third sub-pixel region, the target thickness of the hole injection layer is 8% to 15% of the sum of the thicknesses of the hole injection layer, the hole transport layer, the light-emitting material layer, the electron transport layer and the electron injection layer. In the first sub-pixel region, a target thickness of the hole transport layer is 17% to 22% of the sum of the thicknesses of the hole injection layer, the hole transport layer, the light-emitting material layer, the electron transport layer and the electron injection layer; in the second sub-pixel region, the target thickness of the hole transport layer is 18% to 25% of the sum of the thicknesses of the hole injection layer, the hole transport layer, the light-emitting material layer, the electron transport layer and the electron injection layer; and in the third sub-pixel region, the target thickness of the hole transport layer is 15% to 22% of the sum of the thicknesses of the hole injection layer, the hole transport layer, the light-emitting material layer, the electron transport layer and the electron injection layer. In the first sub-pixel region, a target thickness of the light-emitting material layer is 63% to 73% of the sum of the thicknesses of the hole injection layer, the hole transport layer, the light-emitting material layer, the electron transport layer and the electron injection layer; in the second sub-pixel region, the target thickness of the light-emitting material layer is 62% to 75% of the sum of the thicknesses of the hole injection layer, the hole transport layer, the light-emitting material layer, the electron transport layer and the electron injection layer; and in the third sub-pixel region, the target thickness of the light-emitting material layer is 63% to 77% of the sum of the thicknesses of the hole injection layer, the hole transport layer, the light-emitting material layer, the electron transport layer and the electron injection layer.

In some embodiments, in the above display substrate provided by the embodiment of the disclosure, the pixel defining layer includes first pixel dams and second pixel dams, a height of the first pixel dam is greater than a height of the second pixel dam, adjacent first pixel dams define a plurality of the sub-pixel regions, and adjacent second pixel dams define one sub-pixel region. A same light-emitting functional layer is arranged in the plurality of sub-pixel regions defined by the adjacent first pixel dams, and a height of the light-emitting functional layer is greater than the height of the second pixel dam. Total regions each consisting of the plurality of sub-pixel regions defined by the adjacent first pixel dams and being in a long strip shape are distributed in a matrix. A short edge of the total region extends in a row direction, and all the light-emitting functional layers in the total region in a same column are same in material, and are formed through one inkjet printing process.

In some embodiments, in the above display substrate provided by the embodiment of the disclosure, the first pixel dam includes a first film layer and a second film layer on the first film layer, and the second pixel dam includes the first film layer.

In some embodiments, in the above display substrate provided by the embodiment of the disclosure, at least two sub-pixel regions of the same color are connected. The colors of the sub-pixel regions in the same column are the same, the sub-pixel regions of the same color in the same column are connected through a first channel, the sub-pixel regions of the same color in different columns are connected through a second channel, and the sub-pixel regions of the same color in different columns are not adjacent to one another.

In some embodiments, in the above display substrate provided by the embodiment of the disclosure, the first channel is formed by removing part or all of the pixel defining layer between two sub-pixel regions connected by the first channel; and the second channel is formed by removing part or all of the pixel defining layer between two sub-pixel regions connected by the second channel.

In yet another aspect, an embodiment of the disclosure provides a display apparatus, including the above display substrate.

DETAILED DESCRIPTION

Figure 1:
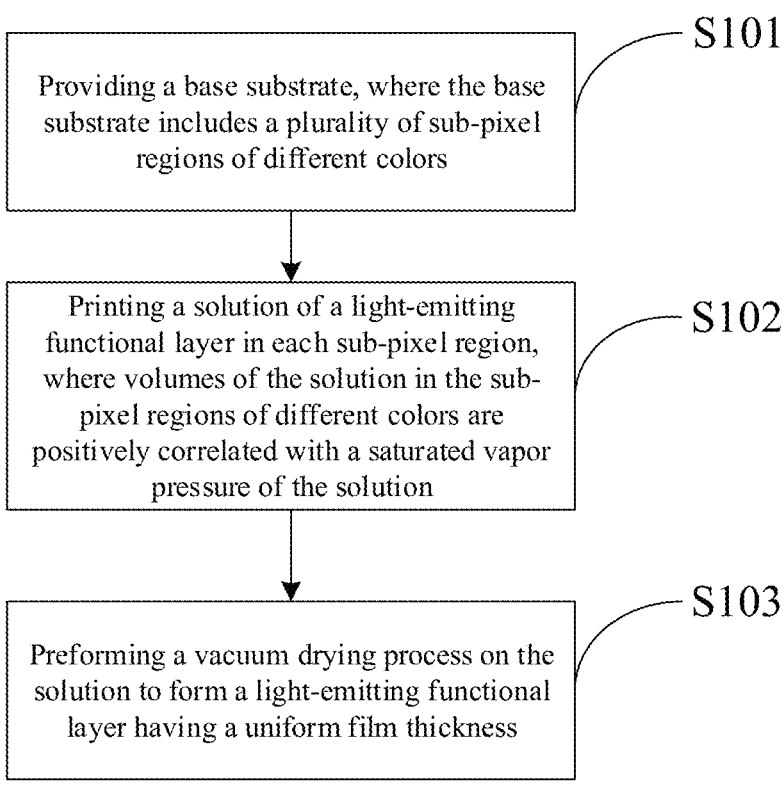
FIG. 1 is a flow diagram of a manufacturing method for a display substrate provided by an embodiment of the disclosure.

In order to make objectives, technical solutions and advantages of embodiments of the disclosure clearer, the technical solutions of the embodiments of the disclosure will be described clearly and completely with reference to accompanying drawings of the embodiments of the disclosure. It should be noted that sizes and shapes of all graphs in the accompanying drawings do not reflect the true scale, and only intend to illustrate the content of the disclosure. The same or similar reference numbers represent the same or similar elements or elements with the same or similar functions from beginning to end. Apparently, the described embodiments are part of the embodiments of the disclosure, but not all the embodiments. On the basis of the described embodiments of the disclosure, all other embodiments obtained by those ordinarily skilled in the art without inventive efforts fall within the protection scope of the disclosure.

Unless otherwise indicated, the technical or scientific terms used here shall have the usual meanings understood by a person of ordinary skill in the art to which the disclosure belongs. The words "first", "second" and the like used in the specification and claim of the disclosure do not indicate any order, quantity or importance, but are only used to distinguish different components. The word "including" or "containing" and the like, means that an element or item preceding the word covers an element or item listed after the word and the equivalent thereof, without excluding other elements or items. The words "inner", "outer", "up", "down" and the like are only used to indicate the relative positional relationship. When the absolute position of the described object changes, the relative positional relationship may also change accordingly.

Generally, before performing an ink jet printing process for an OLED, it is necessary to manufacture a pixel defining layer (PDL) in advance to limit accurate flowing of ink droplets into a specified RGB sub-pixel region. The ink droplets need to be fully spread within an RGB sub-pixel without overflowing.

In the related art, the inkjet printing process for the OLED is under active development, and vacuum drying of a wet organic film is a key process to determine film thickness uniformity, especially, consistency of an entire solvent atmosphere after printing of the ink droplets is very necessary for the film thickness uniformity. Generally, solvent systems and proportions of functional layers of sub-pixel regions of different colors are the same, and saturated vapor pressures of obtained solutions are the same. However, due to different aperture ratios and film thickness requirements of each sub-pixel region of RGB, it is difficult to obtain the same volume of the ink droplets printed in the sub-pixel region of RGB. Due to a microcavity effect, a current basic relation between thicknesses of sub-pixel regions of RGB of each functional film layer is R>G>B. Due to device limitations, a concentration of the solution is limited, resulting in formation of Mura due to different solvent volatilization rates during a vacuum cold drying (VCD) process. If same volume of the ink droplets in each sub-pixel region is necessary, the concentration of each layer of ink droplets needs to be changed. However, different ink droplet concentrations lead to different viscosities and drying rates, which is prone to leading to a printer clogging problem, high process difficulty factor, and Mura phenomenon. Therefore, in the related art, it is difficult to take into account the film thickness uniformity within the RGB three sub-pixel regions in the cold drying process of the ink droplets.

In order to at least solve the above technical problems existing in the related art, an embodiment of the disclosure provides a manufacturing method for a display substrate, as shown in FIG. 1, including the following steps.

S101, providing a base substrate, where the base substrate includes a plurality of sub-pixel regions of different colors.

S102, printing a solution of a light-emitting functional layer in each sub-pixel region, where volumes of the solution in the sub-pixel regions of different colors are positively correlated with a saturated vapor pressure of the solution.

S103, preforming a vacuum drying process on the solution to form a light-emitting functional layer having a uniform film thickness.

In the above manufacturing method provided by the embodiment of the disclosure, the volumes of the solution in the sub-pixel regions of different colors are positively correlated with the saturated vapor pressure of the solution, which can make a drying rate of the solutions of different volumes in the sub-pixel regions of different colors basically the same, so that time taken for complete volatilization of solvents in the sub-pixel regions of different colors is basically the same. That is to say, in a VCD process, the sub-pixel regions of different colors are located in the same solvent atmosphere, and a film layer drying environment within the sub-pixel regions of different colors is the same, which reduces the difficulty of the VCD process and allows uniformity of the film thicknesses of the sub-pixel regions of different colors.

In some embodiments, in the above manufacturing method provided by the embodiment of the disclosure, in order to facilitate adjustment and control of the saturated vapor pressure of the solution, the solution may include a first solvent and a second solvent that are miscible, and a saturated vapor pressure of the first solvent is less than a saturated vapor pressure of the second solvent. In some embodiments, the solution may only include the first solvent and the second solvent that are miscible, and in this case, the saturated vapor pressure of the solution is equal to a sum of a product of the saturated vapor pressure of the first solvent and a volume proportion of the first solvent in the solution, and a product of the saturated vapor pressure of the second solvent and a volume proportion of the second solvent in the solution.

Figure 2:
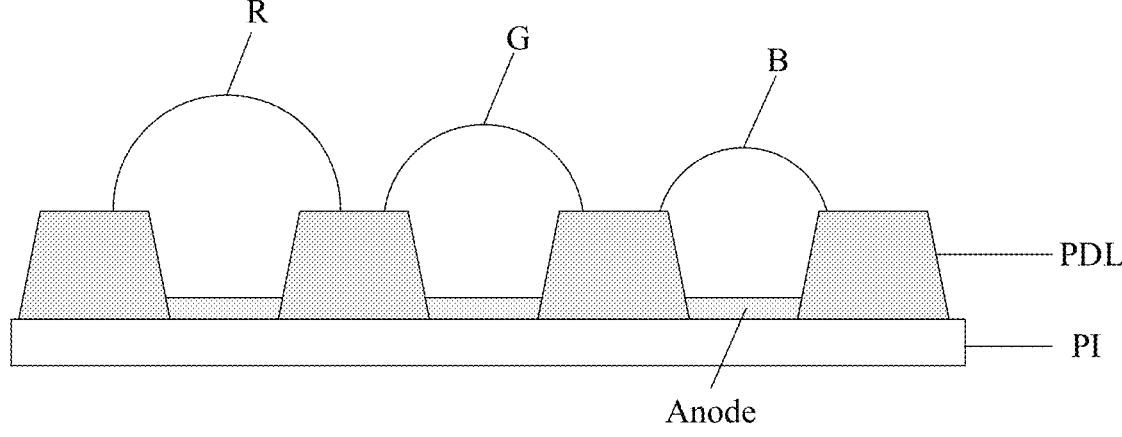
FIG. 2 is a schematic structural diagram of a display substrate in a printing process provided by an embodiment of the disclosure.

In some embodiments, in the above manufacturing method provided by the embodiment of the disclosure, as shown in FIG. 2, the sub-pixel regions may include a plurality of red sub-pixel regions R, a plurality of green sub-pixel regions G and a plurality of blue sub-pixel regions B.

The printing the solution of the light-emitting functional layers in the plurality of sub-pixel regions in S102 may specifically be implemented in the following ways.

Figure 3:
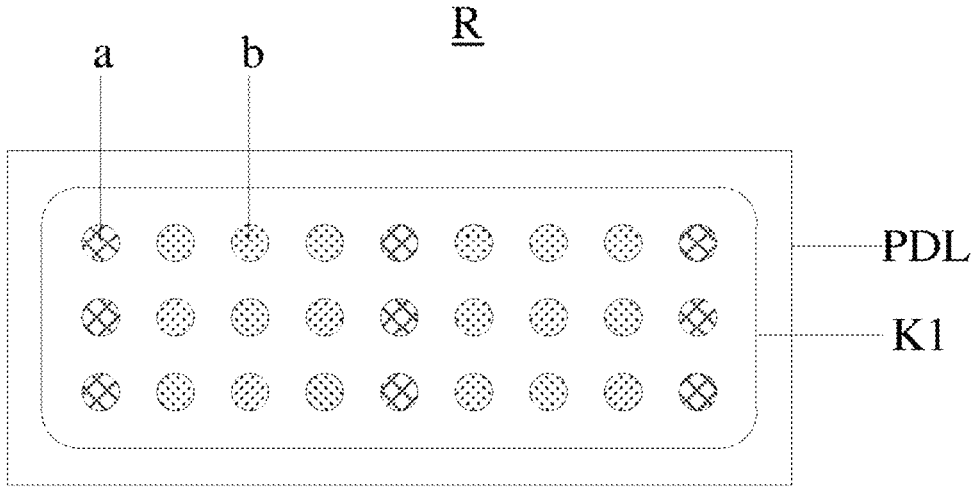
FIG. 3 is a schematic diagram of a solution system provided by an embodiment of the disclosure.
Figure 4:
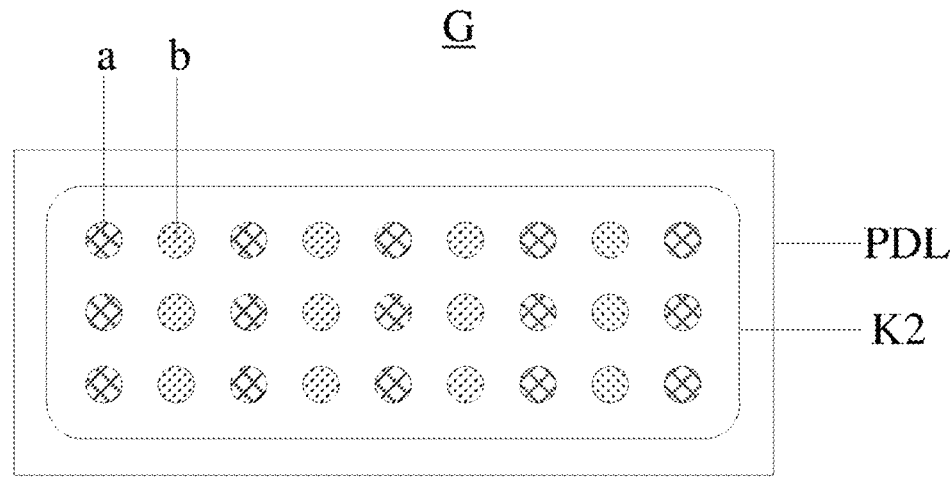
FIG. 4 is another schematic diagram of a solution system provided by an embodiment of the disclosure.
Figure 5:
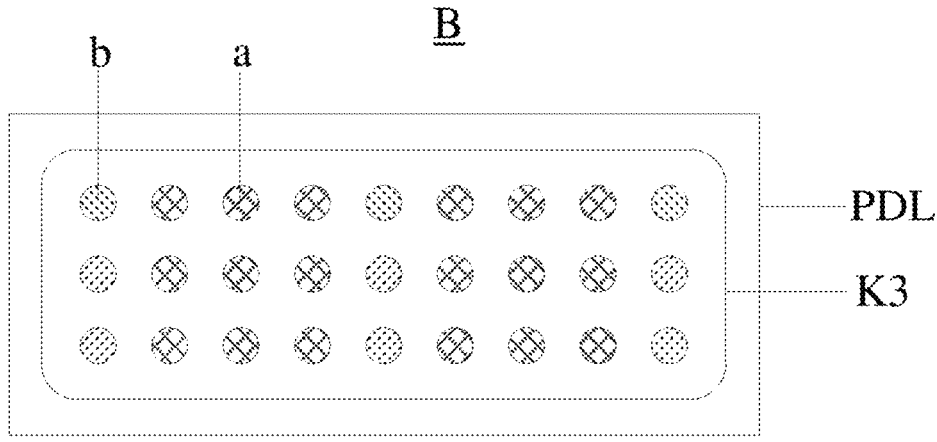
FIG. 5 is yet another schematic diagram of a solution system provided by an embodiment of the disclosure.

A first solution of the light-emitting functional layers is printed in the plurality of red sub-pixel regions R (as shown in FIG. 3), a second solution of the light-emitting functional layers is printed in the plurality of green sub-pixel regions G (as shown in FIG. 4), and a third solution of the light-emitting functional layers is printed in the plurality of blue sub-pixel regions B (as shown in FIG. 5), where a volume of the second solution is greater than or equal to a volume of the third solution and less than or equal to a volume of the first solution, and a saturated vapor pressure of the second solution is greater than or equal to a saturated vapor pressure of the third solution and less than or equal to a saturated vapor pressure of the first solution. The above conditions may cause film thicknesses of the light-emitting functional layer in the red sub-pixel regions R, the green sub-pixel regions G and the blue sub-pixel regions B to sequentially decrease, so as to meet the requirement that the film thicknesses of the light-emitting functional layer in the red sub-pixel regions R, the green sub-pixel regions G and the blue sub-pixel regions B has the same relation as film thicknesses in the related art. Moreover, the above condition may further cause the first solution, the second solution and the third solution to evaporate almost simultaneously, thereby achieving the uniformity of the film thicknesses of the light-emitting functional layer in the red sub-pixel regions R, the green sub-pixel regions G and the blue sub-pixel regions B, ensuring an effective aperture ratio of the red sub-pixel regions R, the green sub-pixel regions G and the blue sub-pixel regions B, and prolonging a service life of a device.

In some embodiments, in the above manufacturing method provided by the embodiment of the disclosure, a ratio of the saturated vapor pressure of the first solution to the saturated vapor pressure of the second solution to the saturated vapor pressure of the third solution is (2.5-1):(2.5-1):1. Exemplarily, volume proportions of the first solvent in the first solution, the second solution and the third solution may be set to sequentially increase, and volume proportions of the second solvent in the first solution, the second solution and the third solution may be set to sequentially decrease to ensure that the saturated vapor pressures of the first solution, the second solution and the third solution sequentially decrease. In this way, it may be ensured that in the simultaneous VCD process, the complete volatilization time of the first solution, the second solution and the third solution is roughly the same, thereby reducing the process difficulty of VCD, and improving the uniformity of the film thicknesses.

In some embodiments, in the above manufacturing method provided by the embodiment of the disclosure, in order to ensure that the saturated vapor pressures of the first solution, the second solution and the third solution sequentially decrease, as shown in FIG. 3 to FIG. 5, it may be implemented in the following ways: in the first solution, the volume proportion of the first solvent a is 5% to 30%, and the volume proportion of the second solvent b is 70% to 95%; in the second solution, the volume proportion of the first solvent a is 30% to 60%, and the volume proportion of the second solvent b is 40% to 70%; and in the third solution, the volume proportion of the first solvent a is 60% to 95%, and the volume proportion of the second solvent b is 5% to 40%.

In some embodiments, in the above manufacturing method provided by the embodiment of the disclosure, the first solvent a may be one or any combination of cumene, isopropyltoluene, 1,3,5-trimethylbenzene, dimethylanisole, and p-diethylbenzene, and the second solvent b may be one or any combination of chlorobenzene, cyclohexanone, and o-xylene. Of course, during specific implementation, the first solvent a and the second solvent b may be selected as other miscible solvents that are well known to those skilled in the art and have good solubility for materials of the light-emitting functional layers, which is not specifically limited here.

In some embodiments, in the above manufacturing method provided by the embodiment of the disclosure, in order to achieve the uniformity of the film thicknesses in all the sub-pixel regions, as shown in FIG. 2, the light-emitting functional layers may be hole injection layers HIL or light-emitting material layers EML, and the volume of the second solution may be greater than the volume of the third solution and less than the volume of the first solution. In other embodiments, the light-emitting functional layers may further be hole transport layers HTL, and the volume of the second solution may be greater than or equal to the volume of the third solution and may be less than or equal to the volume of the first solution.

In some embodiments, in the above manufacturing method provided by the embodiment of the disclosure, in order to match the light-emitting efficiency in each sub-pixel region, when the light-emitting functional layers are the hole injection layers HIL or the hole transport layers HTL, and a concentration of the first solution, a concentration of the second solution, and a concentration of the third solution may be the same; and when the light-emitting functional layers are the light-emitting material layers EML, and the concentration of the first solution may be greater than or equal to the concentration of the third solution and less than or equal to the concentration of the second solution.

Figure 6:
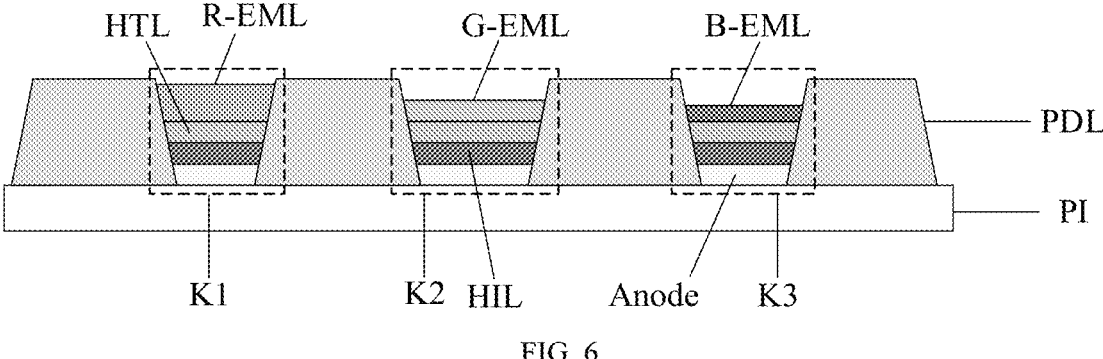
FIG. 6 is a schematic structural diagram of a display substrate provided by an embodiment of the disclosure.
Figure 7:
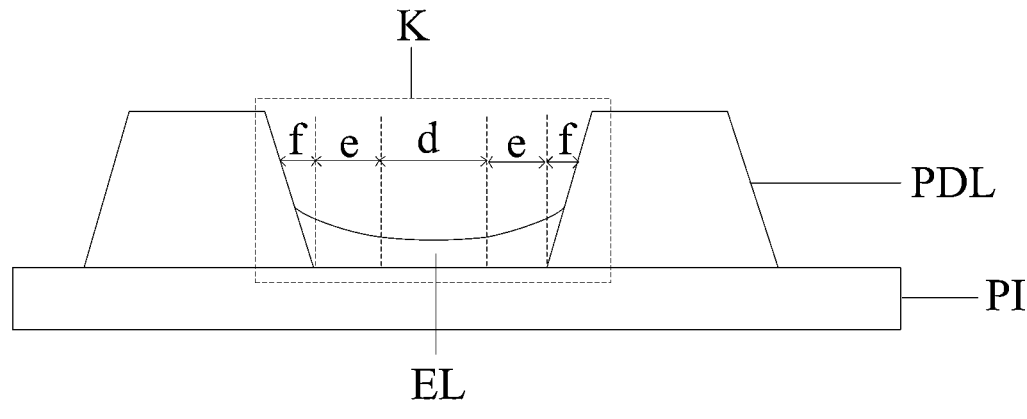
FIG. 7 is another schematic structural diagram of a display substrate provided by an embodiment of the disclosure.

In some embodiments, in the above manufacturing method provided by the embodiment of the disclosure, after providing the base substrate in S101 and before printing the solution of the light-emitting functional layers in the plurality of sub-pixel regions in S102, as shown in FIG. 6, the following steps may further be executed:

forming a pixel defining layer PDL on the base substrate PI, where the pixel defining layer PDL has a first pixel opening K1 in the red sub-pixel region R, a second pixel opening K2 in the green sub-pixel region G, and a third pixel opening K3 in the blue sub-pixel region B; and an area of the third pixel opening K3 may be less than an area of the second pixel opening K2 and greater than an area of the first pixel opening K1. The pixel defining layer PDL with different opening sizes may define accurate flowing of the solution into the RGB sub-pixel regions.

In some embodiments, in the above manufacturing method provided by the embodiment of the disclosure, the plurality of green sub-pixel regions G include: a plurality of first-type green sub-pixel regions G1 and a plurality of second-type green sub-pixel regions G2. An area of the second pixel opening K2 corresponding to the first-type green sub-pixel regions G1 is greater than an area of the second pixel opening K2 corresponding to the second-type green sub-pixel regions G2; and a saturated vapor pressure of the second solution corresponding to the first-type green sub-pixel regions G1 is less than a saturated vapor pressure of the second solution corresponding to the second-type green sub-pixel regions G2. In this way, the second solution of the first-type green sub-pixel regions G1 and the second solution of the second-type green sub-pixel regions G2 may evaporate almost simultaneously, thereby ensuring the uniformity of the film thicknesses of the first-type green sub-pixel regions G1 and the second-type green sub-pixel regions G2.

In some embodiments, in order to reduce the difference in uniformity of the film thicknesses in all the subpixel regions, a ratio of the saturated vapor pressure of the first solution to the saturated vapor pressure of the second solution corresponding to the first-type green sub-pixel regions to the saturated vapor pressure of the second solution corresponding to the second-type green sub-pixel regions to the saturated vapor pressure of the third solution is 1.746:1.404: 1.378:1.

In some embodiments, in the above manufacturing method provided by the embodiment of the disclosure, after providing the base substrate in S101 and before forming the pixel defining layer PDL on the base substrate PI, as shown in FIG. 6, the following step may further be executed:

forming a plurality of first electrodes Anode in the plurality of sub-pixel regions.

In some embodiments, in the above manufacturing method provided by the embodiment of the disclosure, after performing vacuum drying on the solution to form the light-emitting functional layers having the uniform film thicknesses in S103, the following step may further be executed:

forming an electron transport layer ETL, an electron injection layer EIL, and a second electrode Cathode sequentially on the light-emitting functional layers (specifically, the light-emitting material layers EML).

Based on the same inventive concept, an embodiment of the disclosure further provides a display substrate. Principles of the display substrate for solving the problems are similar to that of the above manufacturing method, and therefore, implementation of the display substrate provided by the embodiment of the disclosure may refer to that of the above manufacturing method, and repetitions are omitted.

In some embodiments, as shown in FIG. 6 to FIG. 9, the above display substrate provided by the embodiment of the disclosure may include:

a base substrate PI, having a plurality of sub-pixel regions P of different light-emitting colors;

a pixel defining layer PDL on the base substrate PI, where the pixel defining layer includes a pixel opening K in each sub-pixel region; and a light-emitting functional layer EL on a side of the pixel defining layer PDL facing away from the base substrate PI, where the light-emitting functional layer EL is at least partially located within the pixel opening K, and the light-emitting functional layer EL in the pixel opening K may include a central region d away from the pixel defining layer PDL, a climbing region fin contact with the pixel defining layer PDL, and a transition region e between the central region d and the climbing region f.

In a direction perpendicular to the base substrate PI, a difference between a thickness h1 of the central region d of the light-emitting functional layer EL and a target thickness of the light-emitting functional layer EL may be less than or equal to 5 nm, a difference between a thickness h2 of the transition region e of the light-emitting functional layer EL and the target thickness of the light-emitting functional layer EL may be greater than 5 nm and less than or equal to 20 nm, and a difference between a thickness h3 of the climbing region f of the light-emitting functional layer EL and the target thickness of the light-emitting functional layer EL may be greater than 20 nm.

It should be noted that in the disclosure, the target thickness of the light-emitting functional layer EL refers to a design thickness of the light-emitting functional layer EL. The thickness h1 of the central region d, the thickness h2 of the transition region e, and the thickness h3 of the climbing region f all refer to an actual thickness of each region in a product.

Taking a 55 inch/4K display device of bottom-emission type as an example, a thickness of a first electrode Anode formed before the pixel defining layer PDL is 70 nm.

Specifically, in a blue sub-pixel region B, for the hole injection layer HIL, a target thickness is 30 nm, the thickness of the central region d is 30 nm to 35 nm, the thickness of the transition region e is 35 nm to 50 nm, and a thickness of a climbing region f is greater than or equal to 50 nm; for the hole transport layer HTL, a target thickness is 20 nm, the thickness of the central region d is 20 nm to 25 nm, the thickness of the transition region e is 25 nm to 40 nm, and the thickness of the climbing region f is greater than 40 nm; and for a blue light-emitting material layer B-EML, a target thickness is 60 nm, the thickness of the central region d is 60 nm to 65 nm, the thickness of the transition region e is 65 nm to 80 nm, and the thickness of the climbing region f is greater than 80 nm.

In a green sub-pixel region G, for the hole injection layer HIL, the target thickness is 40 nm, the thickness of the central region d is 40 nm to 45 nm, the thickness of the transition region e is 45 nm to 60 nm, and the thickness of a climbing region f is greater than or equal to 60 nm; for the hole transport layer HTL, the target thickness is 20 nm, the thickness of the central region d is 20 nm to 25 nm, the thickness of the transition region e is 25 nm to 40 nm, and the thickness of the climbing region f is greater than or equal to 40 nm; and for the green light-emitting material layer G-EML, the target thickness is 80 nm, the thickness of the central region d is 80 nm to 85 nm, the thickness of the transition region e is 85 nm to 100 nm, and the thickness of the climbing region f is greater than or equal to 100 nm.

In a red sub-pixel region R, for the hole injection layer HIL, the target thickness is 40 nm, the thickness of the central region d is 40 nm to 45 nm, the thickness of the transition region e is 45 nm to 60 nm, and the thickness of a climbing region f is greater than or equal to 60 nm; for the hole transport layer HTL, the target thickness is 20 nm, the thickness of the central region d is 20 nm to 25 nm, the thickness of the transition region e is 25 nm to 40 nm, and the thickness of the climbing region f is greater than or equal to 40 nm; and for the red light-emitting material layer R-EML, the target thickness is 120 nm, the thickness of the central region d is 120 nm to 125 nm, the thickness of transition region e is 125 nm to 140 nm, and the thickness of the climbing region f is greater than or equal to 140 nm.

Taking a 55 inch/8K display device of a bottom-emission type as an example, a thickness of a first electrode Anode formed before the pixel defining layer PDL is 15 nm.

Specifically, in the blue sub-pixel region B, for the hole injection layer HIL, the target thickness is 6 nm, the thickness of the central region d is 6 nm to 11 nm, the thickness of the transition region e is 11 nm to 26 nm, and the thickness of a climbing region f is greater than or equal to 26 nm; for the hole transport layer HTL, the target thickness is 11 nm, the thickness of the central region d is 11 nm to 16 nm, the thickness of the transition region e is 16 nm to 31 nm, and the thickness of the climbing region f is greater than 31 nm; and for the blue light-emitting material layer B-EML, the target thickness is 55 nm, the thickness of the central region d is 55 nm to 60 nm, the thickness of the transition region e is 60 nm to 75 nm, and the thickness of the climbing region f is greater than 75 nm.

In the green sub-pixel region G, for the hole injection layer HIL, the target thickness is 6 nm, the thickness of the central region d is 6 nm to 11 nm, the thickness of a climbing region f is 11 nm to 26 nm, and the thickness of the transition region c is greater than or equal to 26 nm; for the hole transport layer HTL, the target thickness is 16 nm, the thickness of the central region d is 16 nm to 21 nm, the thickness of the transition region e is 21 nm to 36 nm, and the thickness of the climbing region f is greater than or equal to 36 nm; and for the green light-emitting material layer G-EML, the target thickness is 63 nm, the thickness of the central region d is 63 nm to 68 nm, the thickness of the transition region e is 68 nm to 83 nm, and the thickness of the climbing region f is greater than or equal to 83 nm.

In the red sub-pixel region R, for the hole injection layer HIL, the target thickness is 12 nm, the thickness of the central region d is 12 nm to 17 nm, the thickness of the transition region e is 17 nm to 32 nm, and the thickness of a climbing region f is greater than or equal to 32 nm; for the hole transport layer HTL, the target thickness is 21 nm, the thickness of the central region d is 21 nm to 26 nm, the thickness of the transition region e is 26 nm to 41 nm, and the thickness of the climbing region f is greater than or equal to 41 nm; and for the red light-emitting material layer R-EML, the target thickness is 87 nm, the thickness of the central region d is 87 nm to 92 nm, the thickness of the transition region e is 92 nm to 107 nm, and the thickness of the climbing region f is greater than or equal to 107 nm.

In some embodiments, in the above display substrate provided by the embodiment of the disclosure, 70% to 90% of an entire projection area radiating outward from a center of the light-emitting functional layer EL and having a shape contour roughly same as that of the pixel opening K may be the central region d, 0 to 5% of the entire projection area covering the pixel defining layer PDL and having a shape contour roughly same as that of the pixel opening K may be the climbing region f, and 5% to 30% of the entire projection area between the climbing region f and the central region d and having a shape contour roughly same as that of the pixel opening K may be the transition region e. In other words, an area proportion of the central region d to the light-emitting functional layer EL may reach 70% to 90%, the climbing region f only accounts for 0% to 5% of an area of the light-emitting functional layer EL, and an area proportion of the transition region e between the central region d and the climbing region f to the light-emitting functional layer EL is 5% to 30%.

In some embodiments, in the above display substrate provided by the embodiment of the disclosure, thickness uniformity of the light-emitting functional layer EL within the pixel opening K may be positively correlated with an area of the pixel opening K. In other words, the greater the area of the pixel opening K, the better the thickness uniformity of the light-emitting functional layer EL.

In some embodiments, in the above display substrate provided by the embodiment of the disclosure, as shown in FIG. 6, the sub-pixel regions may include a first sub-pixel region, a second sub-pixel region and a third sub-pixel region, the pixel opening K includes a first pixel opening K1 located in the first sub-pixel region, a second pixel opening K2 located in the second sub-pixel region, and a third pixel opening K3 located in the third sub-pixel region, and an area of the third pixel opening K3 may be greater than an area of the first pixel opening K1 and less than an area of the second pixel opening K2.

The light-emitting functional layer EL may include a hole injection layer HIL, a hole transport layer HTL and a light-emitting material layer EML; and thickness uniformity of the hole injection layer HIL in the first pixel opening K1, the third pixel opening K3 and the second pixel opening K2 sequentially increases, thickness uniformity of the hole transport layer HTL in the first pixel opening K1, the third pixel opening K3 and the second pixel opening K2 sequentially increases, and thickness uniformity of the light-emitting material layer EML in the first pixel opening K1, the third pixel opening K3 and the second pixel opening K2 sequentially increases.

Figure 8:
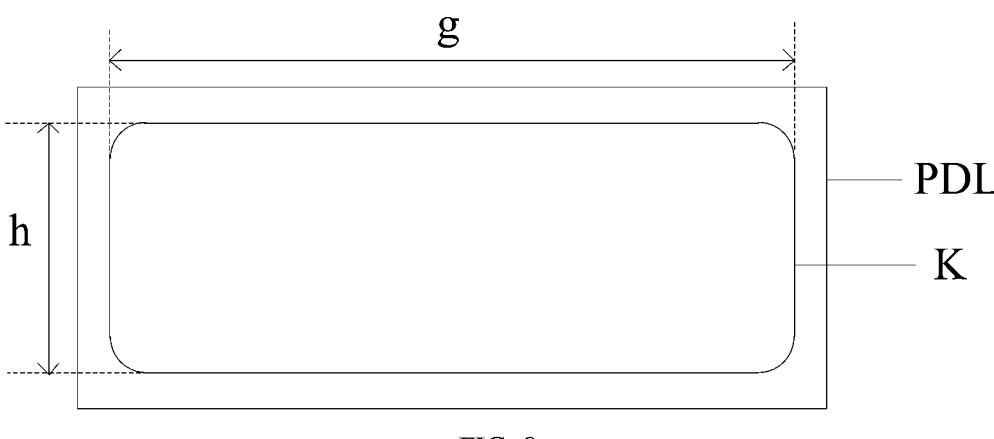
FIG. 8 is yet another schematic structural diagram of a display substrate provided by an embodiment of the disclosure.

In some embodiments, the first sub-pixel region, the second sub-pixel region and the third sub-pixel region may be a red sub-pixel region R, a green sub-pixel region G, and a blue sub-pixel region B sequentially. Taking a 55 inch/4K product of a bottom-emission type as an example for illustration, an aperture ratio of the green sub-pixel region G (equivalent to a ratio of the area of the pixel opening to an area of the sub-pixel region)>an aperture ratio of the blue sub-pixel region B>an aperture ratio of the red sub-pixel region R. In some embodiments, the aperture ratio of the green sub-pixel region G is 23.6%, the aperture ratio of the blue sub-pixel region B is 20.5% and the aperture ratio of the red sub-pixel region R is 19.8%. Under the above condition, film profile of the hole injection layer HIL, the hole transport layer HTL and the light-emitting material layer EML are basically the same. The film profile of the hole injection layer HIL determines the film profile of both the hole transport layer HTL and the light-emitting material layer EML. Taking the film profile of HIL for illustration, a climbing trend (i.e., a U-shaped upward trend) in a direction of a long edge g and a short edge h of the pixel opening K (as shown in FIG. 8) in sub-pixel regions is that green sub-pixel region G>blue sub-pixel region B>red sub-pixel region R respectively. In some embodiments, the uniformity of the film thicknesses of HIL, HTL and EML in the green sub-pixel region G is 76.2%, 80% and 86.2% sequentially. The uniformity of the film thicknesses of HIL, HTL and EML in the blue sub-pixel region B is 74.2%, 78.6% and 82.2% sequentially. The uniformity of the film thicknesses of HIL, HTL and EML in the red sub-pixel region R is 71.6%, 74.1% and 80.5% sequentially.

It should be noted that in the disclosure, the uniformity of the film thicknesses is equal to a percentage of the area of the central region d of the film layer to the area of the light-emitting functional layer EL.

In some embodiments, the display substrate provided by the disclosure may be applied to a 55 inch/4K display device of a bottom-emission type. A thickness of the first electrode Anode is 70 nm, and an average thickness of the hole injection layer HIL in the first sub-pixel region is 40 nm to 50 nm, an average thickness of the hole injection layer HIL in the second sub-pixel region is 40 nm to 50 nm, and an average thickness of the hole injection layer HIL in the third sub-pixel region is 30 nm to 40 nm; an average thickness of the hole transport layer HTL in the first sub-pixel region is 20 nm to 28 nm, an average thickness of the hole transport layer HTL in the second sub-pixel region is 20 nm to 27 nm, and an average thickness of the hole transport layer HTL in the third sub-pixel region is 20 nm to 27 nm; and an average thickness of the light-emitting material layer EML in the first sub-pixel region is 120 nm to 135 nm, an average thickness of the light-emitting material layer EML in the second sub-pixel region is 80 nm to 95 nm, and an average thickness of the light-emitting material layer EML in the third sub-pixel region is 60 nm to 72 nm. Light-emitting efficiency of the first sub-pixel region is 11.5 Cd/A to 15.6 Cd/A, light-emitting efficiency of the second sub-pixel region is 35.1 Cd/A to 41.2 Cd/A, and light-emitting efficiency of the third sub-pixel region is 33 Cd/A to 46 Cd/A.

It should be noted that in the disclosure, the average thickness of a film layer is equal to a weighted average of thicknesses of the central region d, the transition region e and the climbing region f of the film layer in the sub-pixel region.

In some embodiments, the display substrate may be applied to a 55 inch/8K display device of a bottom-emission type. A thickness of the first electrode Anode is 15 nm, and an average thickness of the hole injection layer HIL in the first sub-pixel region may be 12 nm to 20 nm, an average thickness of the hole injection layer HIL in the second sub-pixel region may be 6 nm to 12 nm, and an average thickness of the hole injection layer HIL in the third sub-pixel region may be 6 nm to 12 nm; an average thickness of the hole transport layer in the first sub-pixel region is 21 nm to 30 nm, an average thickness of the hole transport layer in the second sub-pixel region is 16 nm to 26 nm, and an average thickness of the hole transport layer in the third sub-pixel region is 11 nm to 20 nm; and an average thickness of the light-emitting material layer in the first sub-pixel region is 87 nm to 105 nm, an average thickness of the light-emitting material layer in the second sub-pixel region is 63 nm to 78 nm, and an average thickness of the light-emitting material layer in the third sub-pixel region is 55 nm to 70 nm. Light-emitting efficiency of the first sub-pixel region is 16.8 Cd/A to 20.3 Cd/A, light-emitting efficiency of the second sub-pixel region is 36.5 Cd/A to 49.5 Cd/A, and light-emitting efficiency of the third sub-pixel region is 32.4 Cd/A to 47.2 Cd/A.

In some embodiments, the above display substrate provided by the embodiment of the disclosure, as shown in FIG. 6, may further include: an electron transport layer ETL, an electron injection layer EIL, and a second electrode Cathode which are disposed sequentially on a side of the light-emitting material layer EML facing away from the base substrate PI. The electron transport layer ETL, the electron injection layer EIL, and the second electrode Cathode respectively cover all the sub-pixel regions, that is, the electron transport layer ETL, the electron injection layer EIL, and the second electrode Cathode are all arranged all over a whole surface.

In some embodiments, in the above display substrate provided by the embodiment of the disclosure, in order to match the light-emitting efficiency of each sub-pixel region, when applied to a 55 inch/4K display device of a bottom-emission type, the thickness of the first electrode Anode may be set to be 70 nm, in the first sub-pixel region and the second sub-pixel region, a target thickness of the hole injection layer HIL may be 15% to 17% of a sum of thicknesses of the hole injection layer HIL, the hole transport layer HTL, the light-emitting material layer EML, the electron transport layer ETL and the electron injection layer EIL; and in the third sub-pixel region, the target thickness of the hole injection layer HIL may be 12% to 15% of the sum of the thicknesses of the hole injection layer HIL, the hole transport layer HTL, the light-emitting material layer EML, the electron transport layer ETL and the electron injection layer EIL.

In the first sub-pixel region, a target thickness of the hole transport layer HTL may be 6% to 8% of the sum of the thicknesses of the hole injection layer HIL, the hole transport layer HTL, the light-emitting material layer EML, the electron transport layer ETL and the electron injection layer EIL; in the second sub-pixel region, the target thickness of the hole transport layer HTL may be 7% to 10% of the sum of the thicknesses of the hole injection layer HIL, the hole transport layer HTL, the light-emitting material layer EML, the electron transport layer ETL and the electron injection layer EIL; and in the third sub-pixel region, the target thickness of the hole transport layer HTL may be 9% to 11% of the sum of the thicknesses of the hole injection layer HIL, the hole transport layer HTL, the light-emitting material layer EML, the electron transport layer ETL and the electron injection layer EIL.

In the first sub-pixel region, a target thickness of the light-emitting material layer EML may be 38% to 40% of the sum of the thicknesses of the hole injection layer HIL, the hole transport layer HTL, the light-emitting material layer EML, the electron transport layer ETL and the electron injection layer EIL; in the second sub-pixel region, the target thickness of the light-emitting material layer EML may be 30% to 32% of the sum of the thicknesses of the hole injection layer HIL, the hole transport layer HTL, the light-emitting material layer EML, the electron transport layer ETL and the electron injection layer EIL; and in the third sub-pixel region, the target thickness of the light-emitting material layer EML may be 25% to 28% of the sum of the thicknesses of the hole injection layer HIL, the hole transport layer HTL, the light-emitting material layer EML, the electron transport layer ETL and the electron injection layer EIL.

In some embodiments, in the above display substrate provided by the embodiment of the disclosure, in order to match the light-emitting efficiency of each sub-pixel region, when the display substrate is applied to a 55 inch/8K display device of a top-emission type, the thickness of the first electrode Anode may be set to be 15 nm, in the first sub-pixel region, a target thickness of the hole injection layer HIL may be 10% to 14% of a sum of thicknesses of the hole injection layer HIL, the hole transport layer HTL, the light-emitting material layer EML, the electron transport layer ETL and the electron injection layer EIL; in the second sub-pixel region, the target thickness of the hole injection layer HIL may be 7% to 13% of the sum of the thicknesses of the hole injection layer HIL, the hole transport layer HTL, the light-emitting material layer EML, the electron transport layer ETL and the electron injection layer EIL; and in the third sub-pixel region, the target thickness of the hole injection layer HIL may be 8% to 15% of the sum of the thicknesses of the hole injection layer HIL, the hole transport layer HTL, the light-emitting material layer EML, the electron transport layer ETL and the electron injection layer EIL.

In the first sub-pixel region, a target thickness of the hole transport layer HTL may be 17% to 22% of the sum of the thicknesses of the hole injection layer HIL, the hole transport layer HTL, the light-emitting material layer EML, the electron transport layer ETL and the electron injection layer EIL; in the second sub-pixel region, the target thickness of the hole transport layer HTL may be 18% to 25% of the sum of the thicknesses of the hole injection layer HIL, the hole transport layer HTL, the light-emitting material layer EML, the electron transport layer ETL and the electron injection layer EIL; and in the third sub-pixel region, the target thickness of the hole transport layer HTL may be 15% to 22% of the sum of the thicknesses of the hole injection layer HIL, the hole transport layer HTL, the light-emitting material layer EML, the electron transport layer ETL and the electron injection layer EIL.

In the first sub-pixel region, a target thickness of the light-emitting material layer EML may be 63% to 73% of the sum of the thicknesses of the hole injection layer HIL, the hole transport layer HTL, the light-emitting material layer EML, the electron transport layer ETL and the electron injection layer EIL; in the second sub-pixel region, the target thickness of the light-emitting material layer EML may be 62% to 75% of the sum of the thicknesses of the hole injection layer HIL, the hole transport layer HTL, the light-emitting material layer EML, the electron transport layer ETL and the electron injection layer EIL; and in the third sub-pixel region, the target thickness of the light-emitting material layer EML may be 63% to 77% of the sum of the thicknesses of the hole injection layer HIL, the hole transport layer HTL, the light-emitting material layer EML, the electron transport layer ETL and the electron injection layer EIL.

In some embodiments, the first sub-pixel region of the disclosure may be a red sub-pixel region R, the second sub-pixel region may be a green sub-pixel region G, and the third sub-pixel region may be a blue sub-pixel region B.

Figures 9, 10:
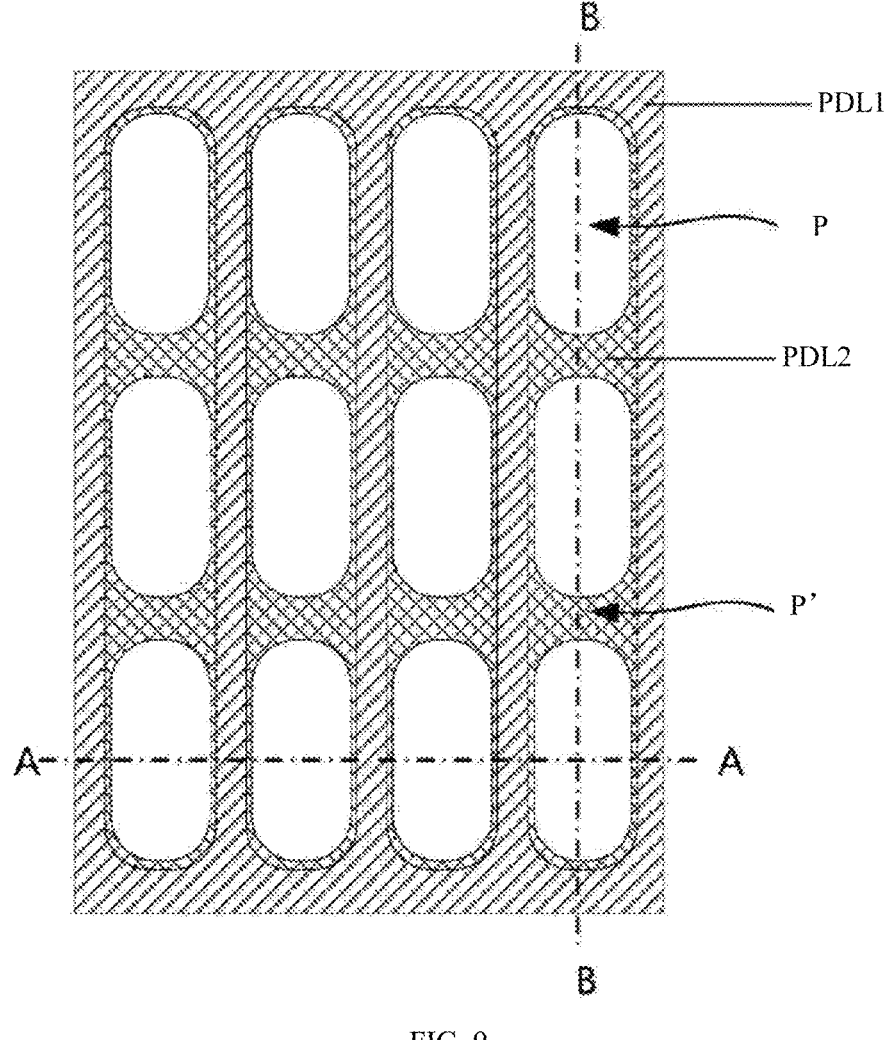
FIG. 9 is yet another schematic structural diagram of a display substrate provided by an embodiment of the disclosure.
FIG. 10 is a schematic cross-sectional view along a line A-A in FIG. 9.

In some embodiments, in the above display substrate provided by the embodiment of the disclosure, as shown in FIG. 9 and FIG. 10, the pixel defining layer PDL may include first pixel dams PDL1 and second pixel dams PDL2, heights of the first pixel dams PDL1 may be greater than heights of the second pixel dams PDL2, the adjacent first pixel dams PDL1 define the plurality of the sub-pixel regions P, and the adjacent second pixel dams PDL2 define one sub-pixel region P.

The same light-emitting functional layer EL is arranged in the plurality of sub-pixel regions P defined by the adjacent first pixel dams PDL1, and a height of the light-emitting functional layer EL is greater than the height of each second pixel dam PDL2.

A total region P' formed by the plurality of sub-pixel regions P defined by the adjacent first pixel dams PDL1 is in a long strip shape and is distributed in a matrix.

A short edge of the total region P' extends in a row direction, and all the light-emitting functional layers EL in the total region P' of the same column are the same in material, and are formed through one inkjet printing process.

The display substrate with the above structure can allow the good uniformity of the film thicknesses of the display film layer in the sub-pixel region.

Figure 11:
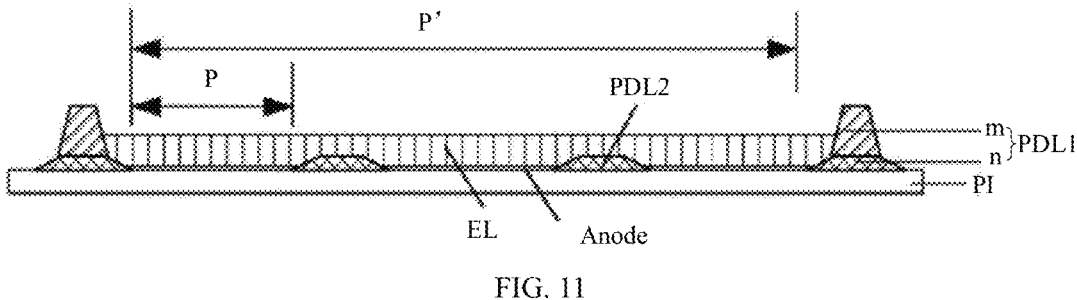
FIG. 11 is a schematic cross-sectional view along a line B-B in FIG. 9.

In some embodiments, in the above display substrate provided by the embodiment of the disclosure, as shown in FIG. 11, the first pixel dam PDL1 may include first film layer n and second film layer m on the first film layer n, and the second pixel dams PDL2 may include the first film layer n. With this arrangement, a height difference between the first pixel dams PDL1 and the second pixel dams PDL2 may be equal to the thickness of the second film layer m.

Figure 12:
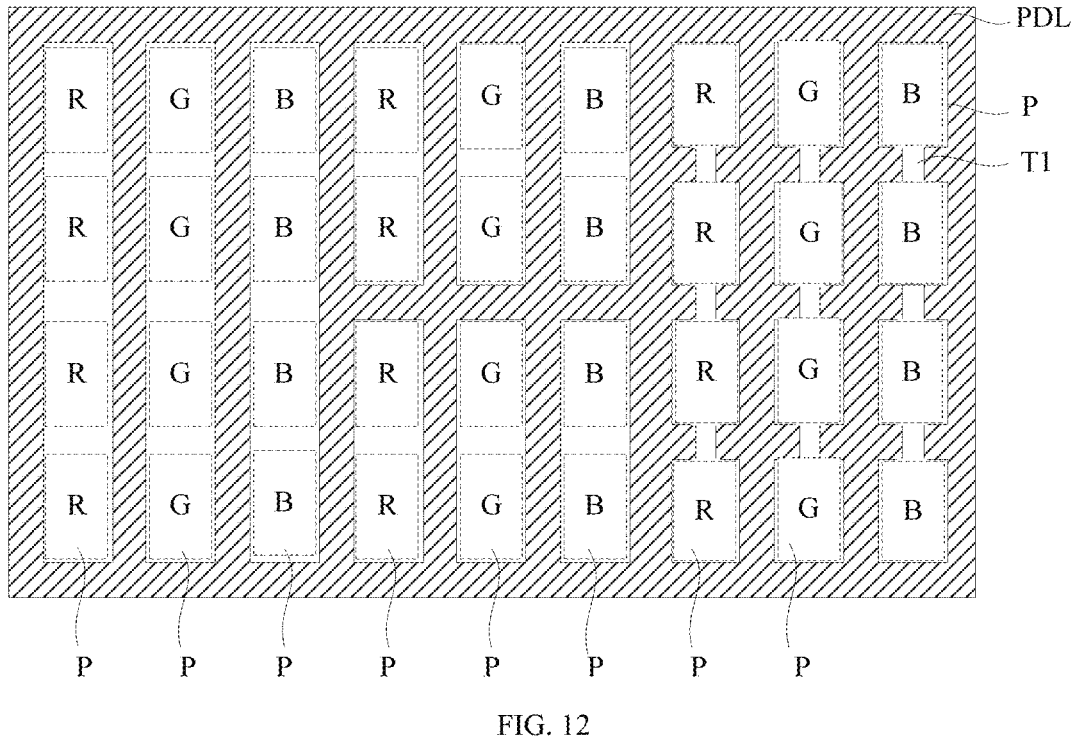
FIG. 12 is yet another schematic structural diagram of a display substrate provided by an embodiment of the disclosure.
Figure 13:
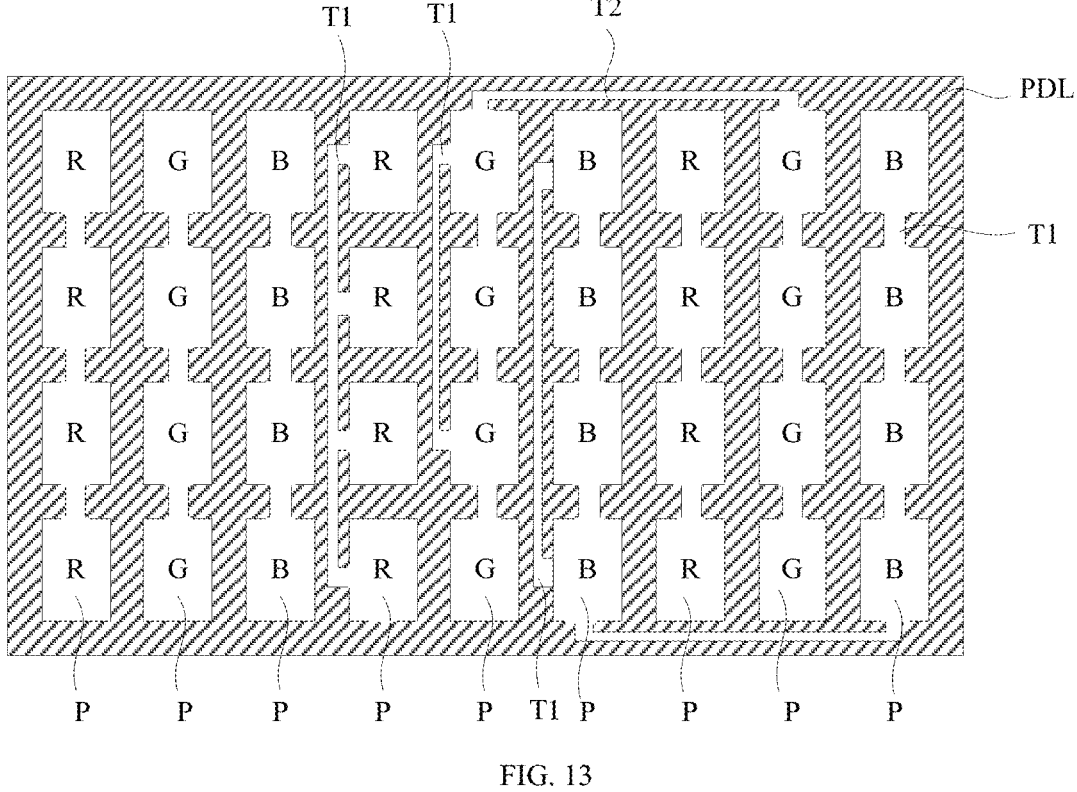
FIG. 13 is yet another schematic structural diagram of a display substrate provided by an embodiment of the disclosure.

In some embodiments, in the above display substrate provided by the embodiment of the disclosure, as shown in FIG. 12 and FIG. 13, the at least two sub-pixel regions P of the same color are connected.

The colors of the sub-pixel regions P in the same column are the same, the sub-pixel regions P of the same color in the same column are connected through a first channel T1, the sub-pixel regions P of the same color in different columns are connected through a second channel T2, and the sub-pixel regions P of the same color in different columns are not adjacent to one another.

By arranging the at least two sub-pixel regions P to be connected, fluidity of the solution is increased, and thus it is easier to form a film layer with uniform thickness in the sub-pixel regions P.

In some embodiments, in the above display substrate provided by the embodiment of the disclosure, as shown in FIG. 12 and FIG. 13, the first channel T1 is formed by removing part or all of the pixel defining layers PDL between the two sub-pixel regions P connected by the first channel T1; and the second channel T2 is formed by removing part or all of the pixel defining layers PDL between the two sub-pixel regions P connected by the first channel T2. That is, widths of the first channel T1 and the second channel T2 may be less than or equal to a width of the sub-pixel regions P.

Based on the same inventive concept, an embodiment of the disclosure further provides a display apparatus, including the above display panel provided by the embodiment of the disclosure. Principles of the display apparatus for solving the problems are similar to that of the above display substrate, and therefore, implementation of the display apparatus provided by the embodiment of the disclosure may refer to that of the above display substrate, and repetitions are omitted.

In some embodiments, the display apparatus may be: any product or component with a display function, such as a mobile phone, a tablet computer, a television, a displayer, a notebook computer, a digital photo frame, a navigator, a smart watch, a fitness wristband and a personal digital assistant. The display apparatus includes but not limited to:

a radio frequency unit, a network module, an audio output unit, an input unit, a sensor, a display unit, a user input unit, an interface unit, a memory, a processor, a power supply and other components. Those skilled in the art may understand that the structure of the above display apparatus does not form limitation to the display apparatus, and the display apparatus may include the above more or less components, or combine certain components, or different component arrangements. In addition, the above display apparatus provided by the embodiment of the disclosure may be applied to organic light-emitting display (OLED), and may also be applied to quantum dot light-emitting display (QLED) and other display technologies with a drive circuit, which is not limited herein.

Apparently, those skilled in the art can make various modifications and variations to the embodiment of the disclosure without departing from the spirit and scope of the embodiment of the disclosure. In this way, if these modifications and variations of the embodiments of the disclosure fall within the scope of the claims of the disclosure and their equivalent art, the disclosure also intends to include these modifications and variations.

What is claimed is:

1. A manufacturing method for a display substrate, comprising:

providing a base substrate, wherein the base substrate comprises a plurality of sub-pixel regions of different colors;

printing a solution of a light-emitting functional layer in the plurality of sub-pixel regions, wherein volumes of solutions in sub-pixel regions of different colors are positively correlated with saturated vapor pressures of the solutions in the sub-pixels regions of different colors; and performing vacuum drying on the solution to form the light-emitting functional layer having a uniform film thickness;

wherein the solution comprises a first solvent and a second solvent that are miscible; and a saturated vapor pressure of the first solvent is less than a saturated vapor pressure of the second solvent;

wherein the sub-pixel regions comprise a plurality of red sub-pixel regions, a plurality of green sub-pixel regions and a plurality of blue sub-pixel regions; and the printing the solution of the light-emitting functional layer in the plurality of sub-pixel regions comprises:

printing a first solution of the light-emitting functional layer in the plurality of red sub-pixel regions;

printing a second solution of the light-emitting functional layer in the plurality of green sub-pixel regions; and printing a third solution of the light-emitting functional layer in the plurality of blue sub-pixel regions;

wherein a volume of the second solution is greater than or equal to a volume of the third solution and less than or equal to a volume of the first solution; and a saturated vapor pressure of the second solution is greater than or equal to a saturated vapor pressure of the third solution and less than or equal to a saturated vapor pressure of the first solution;

wherein after providing the base substrate and before simultaneously printing the solution of the light-emitting functional layer in the plurality of sub-pixel regions, further comprising:

forming a pixel defining layer on the base substrate, wherein the pixel defining layer comprises a first pixel opening in the red sub-pixel region, a second pixel opening in the green sub-pixel region, and a third pixel opening in the blue sub-pixel region; wherein an area of the third pixel opening is less than an area of the second pixel opening and greater than an area of the first pixel opening;

wherein the plurality of green sub-pixel regions comprise:

a plurality of first-type green sub-pixel regions and a plurality of second-type green sub-pixel regions;

an area of a second pixel opening corresponding to the first-type green sub-pixel region is greater than an area of a second pixel opening corresponding to the second-type green sub-pixel region; and a saturated vapor pressure of a second solution corresponding to the first-type green sub-pixel region is less than a saturated vapor pressure of a second solution corresponding to the second-type green sub-pixel region;

wherein a ratio of the saturated vapor pressure of the first solution to the saturated vapor pressure of the second solution corresponding to the first-type green sub-pixel region to the saturated vapor pressure of the second solution corresponding to the second-type green sub-pixel region to the saturated vapor pressure of the third solution is 1.746:1.404:1.378:1.

2. The manufacturing method according to claim 1, wherein a ratio of the saturated vapor pressure of the first solution to the saturated vapor pressure of the second solution to the saturated vapor pressure of the third solution is (2.5~1):(2.5~1):1.

3. The manufacturing method according to claim 1, wherein volume proportions of the first solvent in the first solution, the second solution and the third solution sequentially increase; and volume proportions of the second solvent in the first solution, the second solution and the third solution sequentially decrease.

4. The manufacturing method according to claim 3, wherein a volume proportion of the first solvent in the first solution is 5% to 30%, and a volume proportion of the second solvent in the first solution is 70% to 95%;

a volume proportion of the first solvent in the second solution is 30% to 60%, and a volume proportion of the second solvent in the second solution is 40% to 70%; and a volume proportion of the first solvent in the third solution is 60% to 95%, and a volume proportion of the second solvent in the third solution is 5% to 40%.

5. The manufacturing method according to claim 4, wherein the first solvent is one or any combination of cumene, isopropyltoluene, 1,3,5-trimethylbenzene, dimethylanisole, or p-diethylbenzene; and the second solvent is one or any combination of chlorobenzene, cyclohexanone, or o-xylene.

6. The manufacturing method according to claim 3, wherein the light-emitting functional layer is a hole injection layer or a light-emitting material layer, and the volume of the second solution is greater than the volume of the third solution and less than the volume of the first solution; or the light-emitting functional layer is a hole transport layer.

7. The manufacturing method according to claim 6, The manufacturing method according to claim 6, wherein the light-emitting functional layer is the hole injection layer or the hole transport layer, and a concentration of a functional material in the first solution, a concentration of a functional material in the second solution, and a concentration of a functional material in the third solution are the same; or the light-emitting functional layer is the light-emitting material layer, and the concentration of the functional material in the first solution is greater than or equal to the concentration of the functional material in the third solution and less than or equal to the concentration of the functional material in the second solution.

8. A display substrate, comprising:

a base substrate, comprising a plurality of sub-pixel regions of different light-emitting colors; wherein the plurality of sub-pixel regions comprise a plurality of red sub-pixel regions, a plurality of green sub-pixel regions and a plurality of blue sub-pixel regions;

a pixel defining layer, disposed on the base substrate, and comprising a pixel opening in each sub-pixel region; and a light-emitting functional layer, disposed on a side of the pixel defining layer facing away from the base substrate; wherein the light-emitting functional layer is at least partially located within the pixel opening, and the light-emitting functional layer in the pixel opening comprises a central region away from the pixel defining layer, a climbing region in contact with the pixel defining layer, and a transition region between the central region and the climbing region; wherein the light-emitting functional layer comprises a hole injection layer, a hole transport layer and a light-emitting material layer;

wherein one of the following cases are comprised:

case 1:

in the blue sub-pixel region, a thickness of a central region of the hole injection layer is 30 nm to 35 nm, a thickness of a transition region of the hole injection layer is 35 nm to 50 nm, and a thickness of a climbing region of the hole injection layer is greater than or equal to 50 nm; a thickness of a central region of the hole transport layer is 20 nm to 25 nm, a thickness of a transition region of the hole transport layer is 25 nm to 40 nm, and a thickness of a climbing region of the hole transport layer is greater than 40 nm; and a thickness of a central region of a blue light-emitting material layer is 60 nm to 65 nm, a thickness of a transition region of the blue light-emitting material layer is 65 nm to 80 nm, and a thickness of a climbing region of the blue light-emitting material layer is greater than 80 nm;

in the green sub-pixel region, a thickness of a central region of the hole injection layer is 40 nm to 45 nm, a thickness of a transition region of the hole injection layer is 45 nm to 60 nm, and a thickness of a climbing region of the hole injection layer is greater than or equal to 60 nm; a thickness of a central region of the hole transport layer is 20 nm to 25 nm, a thickness of a transition region of the hole transport layer is 25 nm to 40 nm, and a thickness of a climbing region of the hole transport layer is greater than or equal to 40 nm; and a thickness of a central region of a green light-emitting material layer is 80 nm to 85 nm, a thickness of a transition region of the green light-emitting material layer is 85 nm to 100 nm, and a thickness of a climbing region of the green light-emitting material layer is greater than or equal to 100 nm; and in the red sub-pixel region, a thickness of a central region of the hole injection layer is 40 nm to 45 nm, a thickness of a transition region of the hole injection layer is 45 nm to 60 nm, and a thickness of a climbing region of the hole injection layer is greater than or equal to 60 nm; a thickness of the central region of the hole transport layer is 20 nm to 25 nm, a thickness of a transition region of the hole transport layer is 25 nm to 40 nm, and a thickness of a climbing region of the hole transport layer is greater than or equal to 40 nm; and a thickness of a central region of a red light-emitting material layer is 120 nm to 125 nm, a thickness of a transition region of the red light-emitting material layer is 125 nm to 140 nm, and a thickness of a climbing region of the red light-emitting material layer is greater than or equal to 140 nm;

case 2:

in the blue sub-pixel region, a thickness of a central region of the hole injection layer is 6 nm to 11 nm, a thickness of a transition region of the hole injection layer is 11 nm to 26 nm, and a thickness of a climbing region of the hole injection layer is greater than or equal to 26 nm; a thickness of a central region of the hole transport layer is 11 nm to 16 nm, a thickness of a transition region of the hole transport layer is 16 nm to 31 nm, and a thickness of a climbing region of the hole transport layer is greater than 31 nm; and a thickness of a central region of a blue light-emitting material layer is 55 nm to 60 nm, a thickness of a transition region of the blue light-emitting material layer is 60 nm to 75 nm, and a thickness of a climbing region of the blue light-emitting material layer is greater than 75 nm;

in the green sub-pixel region, a thickness of a central region of the hole injection layer is 6 nm to 11 nm, a thickness of a transition region of the hole injection layer is 11 nm to 26 nm, and a thickness of a climbing region of the hole injection layer is greater than or equal to 26 nm; a thickness of a central region of the hole transport layer is 16 nm to 21 nm, a thickness of the transition region of the hole transport layer is 21 nm to 36 nm, and a thickness of the climbing region of the hole transport layer is greater than or equal to 36 nm; and a thickness of a central region of a green light-emitting material layer is 63 nm to 68 nm, a thickness of a transition region of the green light-emitting material layer is 68 nm to 83 nm, and a thickness of a climbing region of the green light-emitting material layer is greater than or equal to 83 nm; and in the red sub-pixel region R, a thickness of a central region of the hole injection layer is 12 nm to 17 nm, a thickness of a transition region of the hole injection layer is 17 nm to 32 nm, and a thickness of a climbing region of the hole injection layer is greater than or equal to 32 nm; a thickness of a central region of the hole transport layer is 21 nm to 26 nm, a thickness of a transition region of the hole transport layer is 26 nm to 41 nm, and a thickness of a climbing region of the hole transport layer is greater than or equal to 41 nm; and a thickness of a central region of a red light-emitting material layer is 87 nm to 92 nm, a thickness of a transition region of the red light-emitting material layer is 92 nm to 107 nm, and a thickness of a climbing region of the red light-emitting material layer is greater than or equal to 107 nm.

9. The display substrate according to claim 8, wherein a shape contour of an orthographic projection of the light-emitting functional layer on the base substrate is roughly same as that of the pixel opening on the base substrate;

a region radiating outward from a center of the light-emitting functional layer and covering 70% to 90% of an entire area of the orthographic projection of the light-emitting functional layer is the central region;

a region covering the pixel defining layer and covering 0 to 5% of the entire area of the orthographic projection of the light-emitting functional layer is the climbing region; and a region located between the climbing region and the central region and covering 5% to 30% of the entire area of the orthographic projection of the light-emitting functional layer is the transition region.

10. The display substrate according to claim 8, wherein thickness uniformity of the light-emitting functional layer within the pixel opening in each sub-pixel region is positively correlated with an area of the pixel opening in the sub-pixel region.

11. The display substrate according to claim 10, wherein the sub-pixel regions comprise a first sub-pixel region, a second sub-pixel region and a third sub-pixel region, the pixel opening comprises a first pixel opening located in the first sub-pixel region, a second pixel opening located in the second sub-pixel region, and a third pixel opening located in the third sub-pixel region, and an area of the third pixel opening is greater than an area of the first pixel opening and less than an area of the second pixel opening;

wherein thickness uniformity of the hole injection layer in the first pixel opening, the third pixel opening and the second pixel opening sequentially increases;

thickness uniformity of the hole transport layer in the first pixel opening, the third pixel opening and the second pixel opening sequentially increases; and thickness uniformity of the light-emitting material layer in the first pixel opening, the third pixel opening and the second pixel opening sequentially increases.

12. The display substrate according to claim 8, wherein the sub-pixel regions comprise a first sub-pixel region, a second sub-pixel region and a third sub-pixel region;

an average thickness of the hole injection layer in the first sub-pixel region is 40 nm to 50 nm, an average thickness of the hole injection layer in the second sub-pixel region is 40 nm to 50 nm, and an average thickness of the hole injection layer in the third sub-pixel region is 30 nm to 40 nm;

an average thickness of the hole transport layer in the first sub-pixel region is 20 nm to 28 nm, an average thickness of the hole transport layer in the second sub-pixel region is 20 nm to 27 nm, and an average thickness of the hole transport layer in the third sub-pixel region is 20 nm to 27 nm; and an average thickness of the light-emitting material layer in the first sub-pixel region is 120 nm to 135 nm, an average thickness of the light-emitting material layer in the second sub-pixel region is 80 nm to 95 nm, and an average thickness of the light-emitting material layer in the third sub-pixel region is 60 nm to 72 nm.

13. The display substrate according to claim 8, wherein the sub-pixel regions comprise a first sub-pixel region, a second sub-pixel region and a third sub-pixel region;

an average thickness of the hole injection layer in the first sub-pixel region is 12 nm to 20 nm, an average thickness of the hole injection layer in the second sub-pixel region is 6 nm to 12 nm, and an average thickness of the hole injection layer in the third sub-pixel region is 6 nm to 12 nm;

an average thickness of the hole transport layer in the first sub-pixel region is 21 nm to 30 nm, an average thickness of the hole transport layer in the second sub-pixel region is 16 nm to 26 nm, and an average thickness of the hole transport layer in the third sub-pixel region is 11 nm to 20 nm; and an average thickness of the light-emitting material layer in the first sub-pixel region is 87 nm to 105 nm, an average thickness of the light-emitting material layer in the second sub-pixel region is 63 nm to 78 nm, and an average thickness of the light-emitting material layer in the third sub-pixel region is 55 nm to 70 nm.

14. The display substrate according to claim 11, further comprising:

an electron transport layer, an electron injection layer and a second electrode which are arranged sequentially on a side of the light-emitting material layer facing away from the base substrate;

wherein the electron transport layer, the electron injection layer and the second electrode respectively cover all of the sub-pixel regions.

15. The display substrate according to claim 8, wherein the pixel defining layer comprises first pixel dams and second pixel dams, a height of the first pixel dam is greater than a height of the second pixel dam, adjacent first pixel dams define a plurality of sub-pixel regions, and adjacent second pixel dams define one sub-pixel region;

a same light-emitting functional layer is arranged in the plurality of sub-pixel regions defined by the adjacent first pixel dams, and a height of the light-emitting functional layer is greater than the height of the second pixel dam;

total regions, each consisting of the plurality of sub-pixel regions defined by the adjacent first pixel dams and in a long strip shape are distributed in a matrix; and a short edge of the total region extends in a row direction, and all the light-emitting functional layers in the total region in a same column are same in material, and are formed through one inkjet printing process.

* * * * *